(12) United States Patent
Li et al.

(10) Patent No.: US 12,148,846 B2
(45) Date of Patent: Nov. 19, 2024

(54) SOLAR CELL AND A MANUFACTURING METHOD THEREFOR

(71) Applicant: LONGI SOLAR TECHNOLOGY (TAIZHOU) CO., LTD., Taizhou (CN)

(72) Inventors: Hua Li, Taizhou (CN); Hongbo Tong, Taizhou (CN); Hongchao Zhang, Taizhou (CN); Jiyu Liu, Taizhou (CN)

(73) Assignee: LONGI SOLAR TECHNOLOGY (TAIZHOU) CO., LTD., Taizhou (CN)

( * ) Notice: Subject to any disclaimer, the term of this patent is extended or adjusted under 35 U.S.C. 154(b) by 239 days.

(21) Appl. No.: 17/622,212

(22) PCT Filed: Nov. 15, 2019

(86) PCT No.: PCT/CN2019/118909
§ 371 (c)(1),
(2) Date: Dec. 22, 2021

(87) PCT Pub. No.: WO2020/258683
PCT Pub. Date: Dec. 30, 2020

(65) Prior Publication Data
US 2022/0320355 A1    Oct. 6, 2022

(30) Foreign Application Priority Data

Jun. 24, 2019   (CN) .......................... 201910548291.0

(51) Int. Cl.
*H01L 31/02*     (2006.01)
*H01L 31/0224*   (2006.01)
(Continued)

(52) U.S. Cl.
CPC .. *H01L 31/022433* (2013.01); *H01L 31/1864* (2013.01); *H01L 31/068* (2013.01)

(58) Field of Classification Search
None
See application file for complete search history.

(56) References Cited

U.S. PATENT DOCUMENTS

| 2010/0024881 A1* | 2/2010 | Hacke | ................. H01L 31/0516 136/256 |
| 2015/0340518 A1* | 11/2015 | Koehler | .................. C30B 29/06 428/209 |

FOREIGN PATENT DOCUMENTS

| CN | 101950781 A | 1/2011 |
| CN | 102820343 A | 12/2012 |

(Continued)

*Primary Examiner* — Jayne L Mershon
(74) *Attorney, Agent, or Firm* — Bayramoglu Law Offices LLC

(57) ABSTRACT

A solar cell and a manufacturing method of the solar cell are provided. The solar cell includes a silicon substrate, the silicon substrate is deposited with a plurality of fine-grids, the plurality of fine-grids have ohmic contact with the silicon substrate; a plurality of main-grids are disposed on the silicon substrate; the plurality of main-grids intersect and electrically contact with the plurality of fine-grids; at least a part of the plurality of main-grids is formed by sintering an electrode slurry. The plurality of fine-grids and the plurality of main-grids are formed by a combination of a high temperature metallization (sintering) and a low temperature metallization (depositing), to overcome a high cost by using screen printing of silver slurry, in addition, due to the plurality of fine-grids having ohmic contact with the silicon substrate, the solar cell has advantages of small contact resistance and high current collection efficiency.

11 Claims, 2 Drawing Sheets

(51) Int. Cl.
*H01L 31/068* (2012.01)
*H01L 31/18* (2006.01)

(56) References Cited

FOREIGN PATENT DOCUMENTS

| | | | |
|---|---|---|---|
| CN | 103390675 | A | 11/2013 |
| CN | 104134710 | A | 11/2014 |
| CN | 106771416 | A | 5/2017 |
| CN | 108365027 | A | 8/2018 |
| CN | 108717950 | * | 10/2018 |
| CN | 108717950 | A | 10/2018 |
| CN | 208256683 | U | 12/2018 |
| CN | 109244154 | A | 1/2019 |
| EP | 2711988 | A2 | 3/2014 |
| JP | 2010087251 | A | 4/2010 |

\* cited by examiner

SOLAR CELL AND A MANUFACTURING METHOD THEREFOR

CROSS REFERENCE TO RELATED APPLICATIONS

This application is the national stage entry of International Application No. PCT/CN2019/118909, filed on Nov. 15, 2019, which is based upon and claims priority to Chinese Patent Application No. 201910548291.0 filed on Jun. 24, 2019, the entire contents of which are incorporated herein by reference.

TECHNICAL FIELD

The disclosure generally relates to the technical field of solar photovoltaic power generation, in particular to a solar cell and a manufacturing method thereof.

BACKGROUND

Crystalline silicon solar cell has become the most popular solar cell in the market due to its high efficiency of energy conversion. How to improve the photoelectric conversion efficiency of crystalline silicon solar cells while reducing its production cost is the most difficult problem of the industry. How to improve the efficiency of solar cells by providing a new solar cell structure or a new method for manufacturing a new solar cell to enhance the advantage of solar energy as an alternative energy source, has become an important research direction in the field.

At present, in the large-scale manufacturing of silicon solar cells, screen printing of silver slurry is usually used to realize the metallization process of solar cells. However, the accuracy of screen printing is limited, and the morphology of printed electrodes is undulating. In addition, the contact resistance between the electrodes made by screen printing and the silicon substrate is large, and the usage of a large amount of silver slurry makes the production cost high.

SUMMARY

In view of the above defects or deficiencies in the prior art, it is expected to provide a solar cell and its manufacturing method to reduce the contact resistance between the electrode and the silicon substrate and reduce the production cost.

For the first aspect, the disclosure provides a solar cell including a silicon substrate,
- a plurality of fine-grids are deposited on the silicon substrate, the fine-grids are in ohmic contact with the silicon substrate;
- a plurality of main-grids are disposed on the silicon substrate, the main-grids intersect and in electrically contact with the fine-grids;
- at least part of the main-grids are formed by sintering an electrode slurry.

Preferably, each of the main-grids comprises a first electrode and a second electrode which are alternately disposed, the first electrode is formed by sintering the electrode slurry, and the second electrode is formed by depositing.

Preferably, the first electrode is a bonding pad, the second electrode is a connecting grid line connecting the fine-grids, and the width of the connecting grid line is less than or equal to the width of the bonding pad.

Preferably, the quantity of the bonding pads in each of the main-grids is 2 to 20.

Preferably, the fine-grids comprises two or more metal layers disposed in layer configuration.

Preferably, a front dielectric layer is formed on a front side of the silicon substrate, the main-grids are formed on the front dielectric layer, for each of the main-grids, at least part of the main-grid penetrates the front dielectric layer by sintering;

and/or,
a back dielectric layer is formed on a back side of the silicon substrate, wherein the main-grids are formed on the back dielectric layer, for each of the main-grids, at least part of the train-grid penetrates the back dielectric layer by sintering.

Preferably, the fine-grids and the main-grids extend in a straight line, and the fine-grids are perpendicular to the main-grids.

Preferably, the method for manufacturing the solar cell comprises steps of:
- depositing a plurality of fine-grids on the silicon substrate;
- printing an electrode slurry on the silicon substrate;
- performing heating treatment to the silicon substrate, to make the fine-grid have ohmic contact with the silicon substrate, and sinter the electrode slurry to form at least part of the main-grids at the same time;
- or, the method comprises steps as following:
- depositing a plurality of fine-grids on the silicon substrate;
- performing annealing to the silicon substrate formed with a plurality of fine-grids, to make the fine-grid have ohmic contact with the silicon substrate;
- printing electrode slurry on the silicon substrate; and
- sintering the printed electrode slurry, to make the electrode slurry form at least part of the main-grids.

Preferably, the deposition is selected from any one or two combinations of a laser-transfer printing, a chemical plating, a sputtering, an electrical deposition, a physical vapor deposition, a chemical vapor deposition and an atomic layer deposition.

Preferably, the temperature of annealing is 300° C.-900° C.; and
the temperature of sintering is 700° C.-1000° C.

Preferably, the temperature of heating treatment is 500-900° C.

Preferably, the deposition is an electrical deposition;
before the electrical deposition, the silicon substrate with the printed electrode slurry is sintered first; and
during the process of the electrical deposition, at least part of the main-grids formed by sintering, are connected with the negative pole of the power supply, as a contact of a non-seed layer electroplating.

Preferably, the main-grids comprise bonding pads and the connecting grid lines which are alternately disposed;
the width of each of the connecting grid lines is less than or equal to the width of each of the bonding pads; and
during the process of the electrical deposition, the bonding pads are connected with the negative pole of the power supply, as contacts of a non-seed layer electroplating.

In the aforementioned scheme, the fine-grids and the main-grids are formed by the combination of high temperature metallization (sintering) and low temperature metallization (depositing), to overcome the high cost by using screen printing of silver slurry, in addition, due to the fine-grid has ohmic contact with the silicon substrate, it has the advantages of small contact resistance and high current collection efficiency.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art can obtain other figures according to these figures without paying creative work.

DETAILED DESCRIPTION OF THE EMBODIMENTS

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

It should be noted that, the embodiments and the characteristics of the embodiments in the disclosure may be combined without conflict. The following will refer to the attached figures and combine with the embodiments to explain in detail the disclosure for the disclosure.

Figure 1:
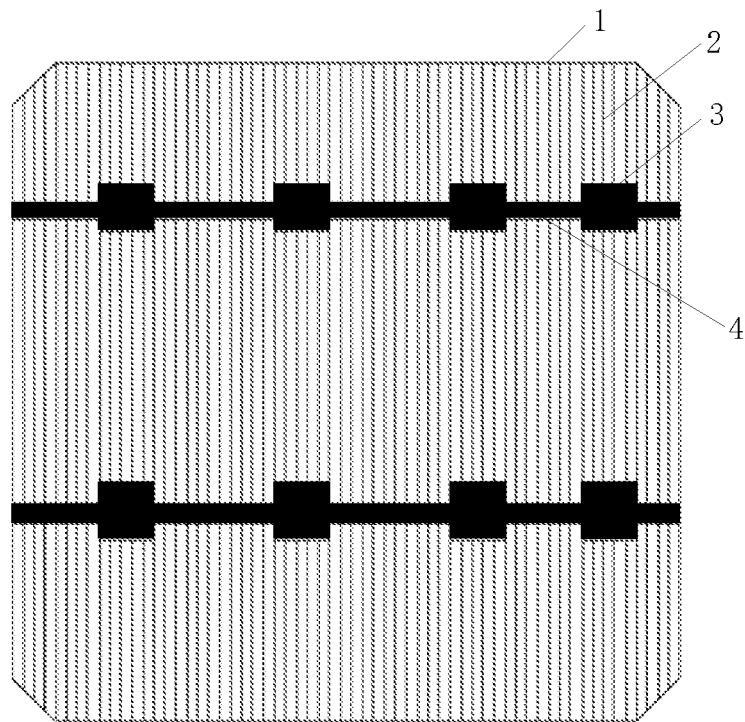
FIG. 1 is a structural diagram of a solar cell according to an embodiment of the disclosure.

As shown in FIG. 1, the solar cell provided by the disclosure includes a silicon substrate 1. The silicon substrate 1 is manufactured by applying the following processes to a silicon wafer: a cleaning process, a texturing process, a texturing diffusion process, an edge etching process, a removing process to remove the silicon phosphate glass and so forth. The processes are for taking as an example but not for limiting the manufacturing way of the silicon substrate.

A plurality of fine-grids 2 are deposited on the silicon substrate 1. The fine-grids 2 are in ohmic contact with the silicon substrate 1. In this embodiment, the fine-grids are of a straight linear, and each of the fine-grids are disposed in parallel. The shape of each of the fine-grids may also be an arc, a bend line or a curve and so forth.

A plurality of main-grids are formed on the silicon substrate 1. The main-grids intersect and electrically contact with the fine-grid, and at least part of each of the main-grids is formed by sintering electrode slurry.

Generally, the width of each of the main-grids is greater than that of each of the fine-grids 2. The fine-grids 2 are used to collect the current generated by the solar cell. The main-grids are used to collect the current collected by the fine-grids 2 and to interconnect between the solar cells.

In summary, throughout the above scheme, the fine-grids and the main-grids are formed by the combination of high temperature metallization (sintering) and low temperature metallization (depositing), which overcomes the high cost by using screen printing of silver slurry. In addition, the fine-grids 2 are in ohmic contact with the silicon substrate 1, which brings the advantages of having small contact resistance and high current collection efficiency.

As another realization, a plurality of main-grids are formed on the silicon substrate 1, each of the main-grids includes a first electrode 3 and a second electrode 4 alternately disposed in sequence. The first electrode 3 is formed by sintering electrode slurry, and the second electrode 4 is formed by deposition. This forming way may minimize the usage of electrode slurry (which may be but not limited to silver slurry) to reduce production costs. The first electrode 3 and the second electrode 4 are alternately disposed in sequence in the disclosure, which may be understood as the first electrode 3 is electrically connected with the second electrode 4, the second electrode 4 is electrically connected with another first electrode 3, and the another first electrode 3 is electrically connected with another second electrode 4 and so forth.

Further, the first electrodes 3 are bonding pads, and the second electrodes 4 are connecting grid lines connected with the fine-grids 2. The width of each of the connecting grid line is less than or equal to the width of each of the bonding pads, the bonding pads are formed by sintering the electrode slurry, as one of the realization methods, the electrode slurry may be silver slurry, and the silver bonding pads are formed by sintering correspondingly, and the width of the bonding pads are the widest in the main-grids, so it has the advantage of good welding performance.

Further, the quantity of the bonding pads in each of the main-grids is 2-20, and the specific number of the bonding pads may be determined according to the size of the solar cell and its welding point. As shown in FIG. 1, four bonding pads are disposed for each of the main-grids.

As a possible implementation way, the above deposition is selected from any one or two combinations of a laser-transfer printing, a chemical plating, a sputtering, an electrical deposition, a physical vapor deposition, a chemical vapor deposition and an atomic layer deposition.

Further, the fine-grids 2 include two or more metal layers disposed in layer configuration. The two or more metal layers may be deposited by the same process or by different processes. Take two metal layers as an example, the first layer may be formed by a chemical plating, and the second layer may be formed by an electrical deposition; or, the first layer may be formed by an atomic layer deposition or a physical vapor deposition, and the second layer may be formed by an electrical deposition; or, the first layer may be formed by a sputtering or a laser transfer printing, and the second layer may be formed by an electrical deposition and so forth. The fine grids 2 may be of a metal-layer configuration of any of the following layer: Ni/Ag layer, Co/Ag layer, Ni/Cu layer, Co/Cu layer, Ni/Cu/Sn layer, Co/Cu/Sn layer, Ni/Cu/Ag layer or Co/Cu/Ag layer.

Further, a front dielectric layer may be formed at the front side of the silicon substrate. When the front dielectric layer exists, the main-grids are formed on the front dielectric layer, and at least part of each of the main-grids penetrates the front dielectric layer by sintering. The front dielectric layer opens the films in the corresponding parts of the fine-grids due to the fine-grids are in ohmic contact with the silicon substrate, that is, the fine-grids are deposited on the part of the front dielectric layer which exposes the silicon substrate.

Similarly, a back dielectric layer maybe formed at the back side of the silicon substrate. When the back dielectric layer exists, the main-grids are formed on the back dielectric layer, and at least part of each of the main-grids penetrates the back dielectric layer by sintering. The back dielectric layer opens the films in the corresponding parts of the fine-grids due to the fine-grids are in ohmic contact with the silicon substrate, that is, the fine-grids are deposited on the part of the back dielectric layer which exposes the silicon substrate.

According to different practical situations, it is certainly not necessary for the main-grids to have ohmic contact with the silicon substrate, which means, the main-grids may also be selected from non-sintered slurry.

Further, the fine-grids 2 and the main-grids both extend in a straight line, and the fine-grids 2 are perpendicular to the main-grids. The structure is convenient for manufacturing along with a great capacity for current collection.

Figure 2:
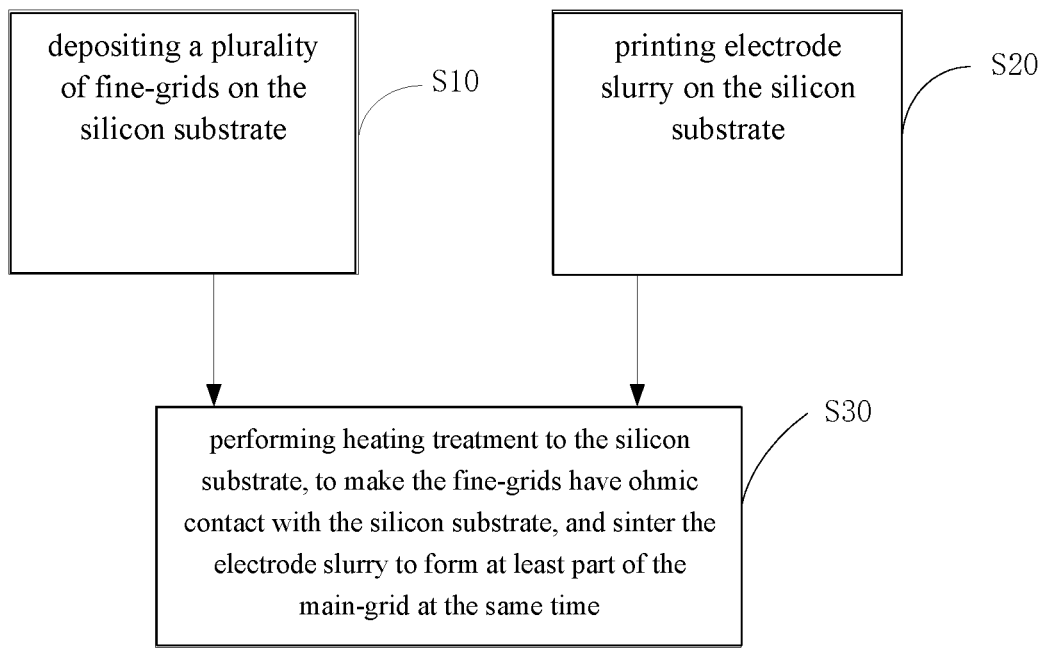
FIG. 2 is a flowchart of a method for manufacturing the solar cell according to the first embodiment of the disclosure.

In the second aspect, as shown in FIG. 2, the disclosure provides a method for manufacturing the solar cell of the aforementioned embodiment, which includes the following steps:

S10: depositing a plurality of fine-grids on a silicon substrate;

For example, but not limited to, the deposition is selected from any one or two combinations of a laser-transfer printing, a chemical plating, a sputtering, an electrical deposition, a physical vapor deposition, a chemical vapor deposition and an atomic layer deposition. The fine-grids 2 formed by deposition may either be a single metal layer or multiple metal layers disposed in layer configuration, the multiple metal layers are formed by a plurality of deposition processes, and the deposition process may either be one of the above, or any two or more combinations.

Take a structure of two metal layers as an example, the first layer may be formed by a chemical plating, and the second layer may be formed by an electrical deposition; or, the first layer may be formed by an atomic layer deposition or a physical vapor deposition, and the second layer may be formed by an electrical deposition; or, the first layer may be formed by a sputtering or a laser transfer printing, and the second layer may be formed by an electrical deposition and so forth. The fine-grids 2 may be of a metal-layer configuration of any of the following layer: Ni/Ag layer, Co/Ag layer, Ni/Cu layer, Co/Cu layer, Ni/Cu/Sn layer, Co/Cu/Sn layer, Ni/Cu/Ag layer or Co/Cu/Ag layer.

S20: printing electrode slurry on the silicon substrate;

The electrode slurry may be printed on the silicon substrate by screen printing, for example, but not limited to print electrode slurry in shapes of strip, or in shapes of dotlike. In some embodiments, take printed dotlike electrode slurry as an example, the following step S30 is performed to form part of the main-grids by sintering.

S30: performing heating treatment to the silicon substrate, to make the fine-grids have ohmic contact with the silicon substrate, and to sinter the electrode slurry to form at least part of the main-grids at the same time;

It should be noted that the step numbers in the disclosure are not restrictions in the order of the steps, but only to distinguish between different steps, unless otherwise stated. For example, in practical process, the above step S10 may be performed first and the above step S20 may be performed after, or, the above step S20 may be performed first and then to the above step S10.

In this embodiment, after heating treatment, the metal at the bottom of the fine-grids and the silicon within the silicon substrate may be formed as metal silicide, to make the fine-grids have ohmic contact with the silicon substrate, which has the advantages of having small contact resistance and high current collection efficiency. The electrode slurry is sintered to form the main-grids during the heating treatment. Since the process of achieving ohmic contact between the fine-grids and the silicon substrate and the process of forming the main-grids by sintering the electrode slurry are accomplished in the same heating treatment, hence the process flow is simplified, the damage and adverse effect to the solar cell brought by high temperature are reduced, and the heat budget for the formation of the fine-grids and the main-grids are also greatly reduced.

As a realizable way, the temperature of heating treatment is 500-900° C. Heating treatments is, for example, annealing, but not limited. The annealing process may be performed in an annealing furnace.

Figure 3:
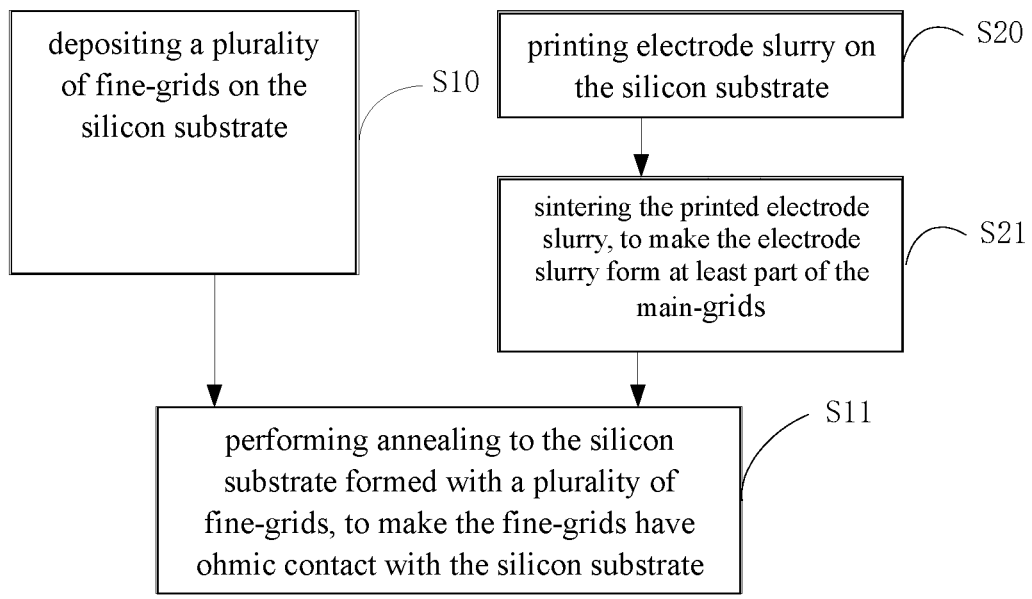
FIG. 3 is a flowchart of a method for manufacturing the solar cell according to the second embodiment of the disclosure.

Further, as shown in FIG. 3, the method for manufacturing the solar cell provided by another embodiment of the disclosure, including the following steps:

S10: depositing a plurality of the fine-grids on the silicon substrate;

S11: performing annealing to the silicon substrate having a plurality of fine-grids formed thereon, to make the fine-grids have ohmic contact with the silicon substrate;

As a possible implementation way, the temperature may be 300° C.-900° C. during annealing. The annealing time may last from a few seconds to a few minutes, which depends on the annealing temperature and requirements of manufacturing processes. For example, in an embodiment, the material that the main-grids contact with the silicon substrate is nickel (when the main-grid is of a single layer structure, the main-grid is a nickel metal layer; when the main-grid is of a multiple layer structure, the lowest layer of the main-grid is a nickel metal layer), the annealing temperature may be 370° C., and the annealing time may be 3 minutes. In another embodiment, the material that the min-grids contact with the silicon substrate is cobalt, the annealing temperature is 500° C., and the annealing time is 30 seconds. Good ohmic contact may be formed at different annealing temperatures and annealing times. For the situation of the material that the main-grids contact with the silicon substrate is nickel, the nickel silicide (NiSi) with low resistance is formed after annealing. For the situation of the material that the main-grids contact with the silicon substrate is cobalt, the cobalt silicide (CoSi2) low resistance is formed after annealing.

In another embodiment, the annealing temperature may be 500° C.-900° C. Correspondingly, the electrode slurry forming the first electrode may be low temperature electrode slurry, and the sintering temperature of the low temperature electrode slurry is between 550° C. and 600° C.

The process of annealing may be divided into once annealing and twice annealing, the twice annealing requires the annealing temperature of the second annealing process in the twice annealing higher than the annealing temperature of the first annealing process in the twice annealing. In one embodiment, the twice annealing is used to form the nickel silicide with low resistance, The annealing temperature for the first annealing process is 260° C.-310° C. for 30 seconds, and the annealing temperature for the second annealing process is 400° C.-500° C. for 30 seconds. In another embodiment, the twice annealing is used to form the cobalt silicide, the annealing temperature for the first annealing process is 400° C.-550° C., and the annealing temperature for the second annealing process is 700° C.-850° C. The twice annealing may effectively inhibit ion diffusion and reduce damage to the silicon substrate, silicide films with small resistivity and uniform properties are formed between the main-grids and the silicon substrate, and the morphology between the metal silicide and the silicon substrate is smooth.

S20: printing electrode slurry on the silicon substrate;

S21: sintering the printed electrode slurry, to make the electrode slurry form at least part of the main-grids.

The temperature for sintering may be but not limited to 700° C.-1000° C.

In the disclosure, the electrode slurry may be sintered by putting the entire silicon substrate printed with the electrode slurry into a sintering furnace, or by means of laser to sinter part of the printing area with the electrode slurry.

A local heating, such as but not limited to a laser heating, it guides a laser beam to the electrode slurry to perform the local heating on the electrode slurry, to be cured and formed. The laser beam may have pulse duration from 1 nanosecond to 10 milliseconds. The laser beam may be emitted by a continuous wave laser or a pulse laser. The laser beam has a wavelength from 100 nanoseconds to 2000 nanoseconds.

By using the above local heating method, the entire silicon substrate does not need to be sintered, which may reduce the heat damage to the silicon substrate and the adverse effect on the service life of cell.

In some embodiments, the deposition may be an electrical deposition. Before the electrical deposition, the step of sintering the printed electrode slurry first is performed. During the process of the electrical deposition, at least part of the main-grids formed by sintering are connected with the negative pole of the power supply, as a contact of a non-seed layer electroplating. The non-seed layer electroplating mentioned in the disclosure refers to a seed layer, which is not necessary to be formed at the positions corresponding to the formed fine-grids and the main-grids before the electroplating. The non-seed layer electroplating may be realized in this way, the previous step of sintering provides the contact for subsequent electrical depositions and simplify the steps of process.

Further, the main-grids include alternately disposed the bonding pads and the connecting grid lines; the width of each of the connecting grid line is less than or equal to the width of each of the bonding pads. During the electrical deposition, the bonding pads are connected with the negative pole of the power supply as a contact of the non-seed player electroplating. The bonding pads may be part of the main-grids formed by sintering dotlike electrode slurry, and the connecting grid lines may be metal layers deposited between adjacent bonding pads.

The implementation way may be, but not limited to be, performed by the following processes: firstly, multi-segment connecting grid lines with interval settings are formed by the deposition, then the dotlike electrode slurry is formed between the adjacent two connecting grid lines by screen printing, and after that the electrode slurry is sintered.

In order to reduce recombination, the following steps are included before forming the fine-grids and the main-grids:

Forming a dielectric layer on the surface of the silicon substrate;

A dielectric layer may be formed on the surface of the silicon substrate by deposition, any one or any combinations of silicon nitride, silicon oxide, hydrogen oxidation silicon, aluminium oxide, aluminum oxynitride, silicon carbide, amorphous silicon and polycrystalline silicon may be used to form the dielectric layer in the disclosure.

The dielectric layer is patterned, to form a plurality of forming open film areas of the fine-grids that expose the silicon substrate, and at least one forming open film area of the main-grids that exposes the silicon substrate. The forming open film areas of the fine-grids intersect with the forming open film areas of the main-grids. The forming open film areas of the fine-grids are used for depositing to form the fine-grids, and the forming open film areas of the main-grids are used for forming the main-grids. The patterning is achieved by, for example but not limited as, an etching process.

Electrode slurry which are used to form the first electrodes are printed at intervals in the forming open film areas of the main-grids, and the electrode slurry is sintered (e.g. by local sintering), to make the electrode slurry sinter to form the first electrodes and have ohmic contact with the silicon substrate.

As another embodiment, the following main-grid patterns may also be used; a plurality of main-grid forming belts are formed, each of the main-grid forming belts include a plurality of forming open film areas of the second electrodes, which are interval disposed, each forming open area of the second electrodes exposes the silicon substrate, and the forming open areas of the fine-grids intersect with the main-grid forming belts.

The "one embodiment", "an embodiment" or "one or more embodiments" as used herein means that particular features, structures or characteristics described with reference to an embodiment are included in at least one embodiment of the present application. Moreover, it should be noted that here an example using the wording "in an embodiment" does not necessarily refer to the same one embodiment.

The description provided herein describes many concrete details. However, it can be understood that the embodiments of the present application may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present application may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present application, and not to limit them. Although the present application is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present application.

What is claimed is:

1. A solar cell, comprising a silicon substrate, wherein
a plurality of fine-grids are deposited on the silicon substrate, the plurality of fine-grids are in ohmic contact with the silicon substrate;
a plurality of main-grids are disposed on the silicon substrate, the plurality of main-grids intersect and in electrically contact with the plurality of fine-grids; and
at least a part of the plurality of main-grids are formed by sintering an electrode slurry;
wherein each of the plurality of main-grids comprises a bonding pad and a connecting grid line connecting the plurality of fine-grids, wherein the bonding pad and the connecting grid line are alternately disposed, the bonding pad is formed by sintering the electrode slurry, and the connecting grid line is formed by an electrical deposition, a width of the connecting grid line is less than or equal to a width of the bonding pad; during the electrical deposition, the bonding pad is connected with a negative pole of a power supply, as a contact of a non-seed layer electroplating;
wherein each of the plurality of fine-grids comprises two or more metal layers disposed in a layer configuration, and the metal layers are deposited by different processes, each of the fine grids comprises a metal-layer configuration of any of: Ni/Ag layer, Co/Ag layer, Ni/Cu layer, Co/Cu layer, Ni/Cu/Sn layer, Co/Cu/Sn layer, Ni/Cu/Ag layer or Co/Cu/Ag layer.

2. The solar cell according to claim 1, wherein a quantity of bonding pads in the each of the plurality of main-grids is 2 to 20.

3. The solar cell according to claim 1, wherein a front dielectric layer is formed on a front side of the silicon substrate, the plurality of main-grids are formed on the front dielectric layer, for each of the plurality of main-grids, at least the part of the plurality of main-grids penetrates the front dielectric layer by sintering; or,
a back dielectric layer is formed on a back side of the silicon substrate, wherein the plurality of main-grids are formed on the back dielectric layer, for the each of the plurality of main-grids, at least the part of the plurality of main-grids penetrates the back dielectric layer by sintering.

4. The solar cell according to claim 1, wherein the plurality of fine-grids and the plurality of main-grids extend in a straight line, and the plurality of fine-grids are perpendicular to the plurality of main-grids.

5. A method for manufacturing the solar cell according to claim 1, comprising the following steps of:
depositing the plurality of fine-grids on the silicon substrate;
printing the electrode slurry on the silicon substrate;
performing a heating treatment to the silicon substrate, to make the plurality of fine-grids have the ohmic contact with the silicon substrate, and sinter the electrode slurry to form at least the part of the plurality of main-grids at a same time;
or, the method comprising the following steps of:
depositing the plurality of fine-grids on the silicon substrate;
performing annealing to the silicon substrate formed with the plurality of fine-grids, to make the plurality of fine-grids have the ohmic contact with the silicon substrate;
printing the electrode slurry on the silicon substrate to obtain a printed electrode slurry; and
sintering the printed electrode slurry, to make the printed electrode slurry form at least the part of the plurality of main-grids.

6. The method according to claim 5, wherein the depositing is selected from any one or two or more than two combinations of a laser-transfer printing, a chemical plating, a sputtering, an electrical deposition, a physical vapor deposition, a chemical vapor deposition and an atomic layer deposition.

7. The method according to claim 5, wherein a temperature of the annealing is 300° C.-900° C.; and
a temperature of the sintering is 700° C.-1000° C.

8. The method according to claim 5, wherein a temperature of the heating treatment is 500-900° C.

9. The method according to claim 5, wherein the depositing is an electrical deposition;
before the electrical deposition, the silicon substrate with the printed electrode slurry is sintered first; and
during a process of the electrical deposition, at least the part of the plurality of main-grids formed by sintering are connected with a negative pole of a power supply, as a contact of a non-seed layer electroplating.

10. The method for manufacturing the solar cell according to claim 9, wherein the plurality of main-grids comprise bonding pads and connecting grid lines, wherein the bonding pads and the connecting grid lines are alternately disposed;
a width of each of the connecting grid lines is less than or equal to a width of each of the bonding pads; and
during the process of the electrical deposition, each of the bonding pads is connected with the negative pole of the power supply, as the contact of the non-seed layer electroplating.

11. The method according to claim 5, wherein before forming the plurality of fine-grids, the method further comprising:
forming a dielectric layer on a surface of the silicon substrate by deposition, the dielectric layer is formed by any one or any combinations of silicon nitride, silicon oxide, hydrogen oxidation silicon, aluminium oxide, aluminum oxynitride, silicon carbide, amorphous silicon and polycrystalline silicon.

* * * * *